(12) United States Patent
Zhang et al.

(10) Patent No.: US 10,698,238 B2
(45) Date of Patent: Jun. 30, 2020

(54) LIQUID CRYSTAL DISPLAY PANEL AND CONTROLLING CIRCUIT

(71) Applicant: Shenzhen China Star Optoelectronics Semiconductor Display Technology Co., Ltd., Shenzhen, Guangdong (CN)

(72) Inventors: Xianming Zhang, Shenzhen (CN); Wenfang Li, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 274 days.

(21) Appl. No.: 15/574,969

(22) PCT Filed: Nov. 6, 2017

(86) PCT No.: PCT/CN2017/109526
§ 371 (c)(1),
(2) Date: Nov. 17, 2017

(87) PCT Pub. No.: WO2019/061682
PCT Pub. Date: Apr. 4, 2019

(65) Prior Publication Data
US 2019/0101777 A1 Apr. 4, 2019

(30) Foreign Application Priority Data
Sep. 30, 2017 (CN) .......................... 2017 1 0918653

(51) Int. Cl.
*H02H 3/08* (2006.01)
*G02F 1/133* (2006.01)
*G02F 1/1345* (2006.01)
*H03K 17/54* (2006.01)
*G09G 3/36* (2006.01)
*H02H 9/02* (2006.01)
(Continued)

(52) U.S. Cl.
CPC ...... *G02F 1/13306* (2013.01); *G02F 1/13454* (2013.01); *G09G 3/36* (2013.01); *H02H 9/02* (2013.01); *H03K 17/0812* (2013.01); *H03K 17/54* (2013.01); *G02F 2201/503* (2013.01); *G05F 1/573* (2013.01); *G09G 2330/025* (2013.01); *G09G 2330/026* (2013.01); *G09G 2330/027* (2013.01); *G09G 2330/04* (2013.01); *H02H 3/08* (2013.01)

(58) Field of Classification Search
USPC .................................... 361/86–87, 93.7–93.9
See application file for complete search history.

(56) References Cited

U.S. PATENT DOCUMENTS

| | | | | |
|---|---|---|---|---|
| 2014/0146426 A1* | 5/2014 | Murakami | ....... | H03K 19/00315 361/56 |
| 2018/0048140 A1* | 2/2018 | Takuma | .................. | B60R 16/02 |
| 2018/0109251 A1* | 4/2018 | Djelassi | ........... | H03K 3/356182 |

* cited by examiner

*Primary Examiner* — Danny Nguyen
(74) *Attorney, Agent, or Firm* — Mark M. Friedman

(57) ABSTRACT

A controlling circuit includes a pulse width modulation (PWM) circuit, a level shifter having a current source therein, a capacitor connected to a current source, an overcurrent protection circuit connected to the level shifter, and a controlling circuit configured to enable or disable a function of overcurrent protection of the overcurrent protection circuit within designated time. The controlling circuit includes a switch device. An input of the switch device connected to an output terminal of the capacitor, and an output terminal of the switch device connected to a controlling terminal of the overcurrent protection circuit.

7 Claims, 1 Drawing Sheet

(51) Int. Cl.
*H03K 17/0812* (2006.01)
*G05F 1/573* (2006.01)

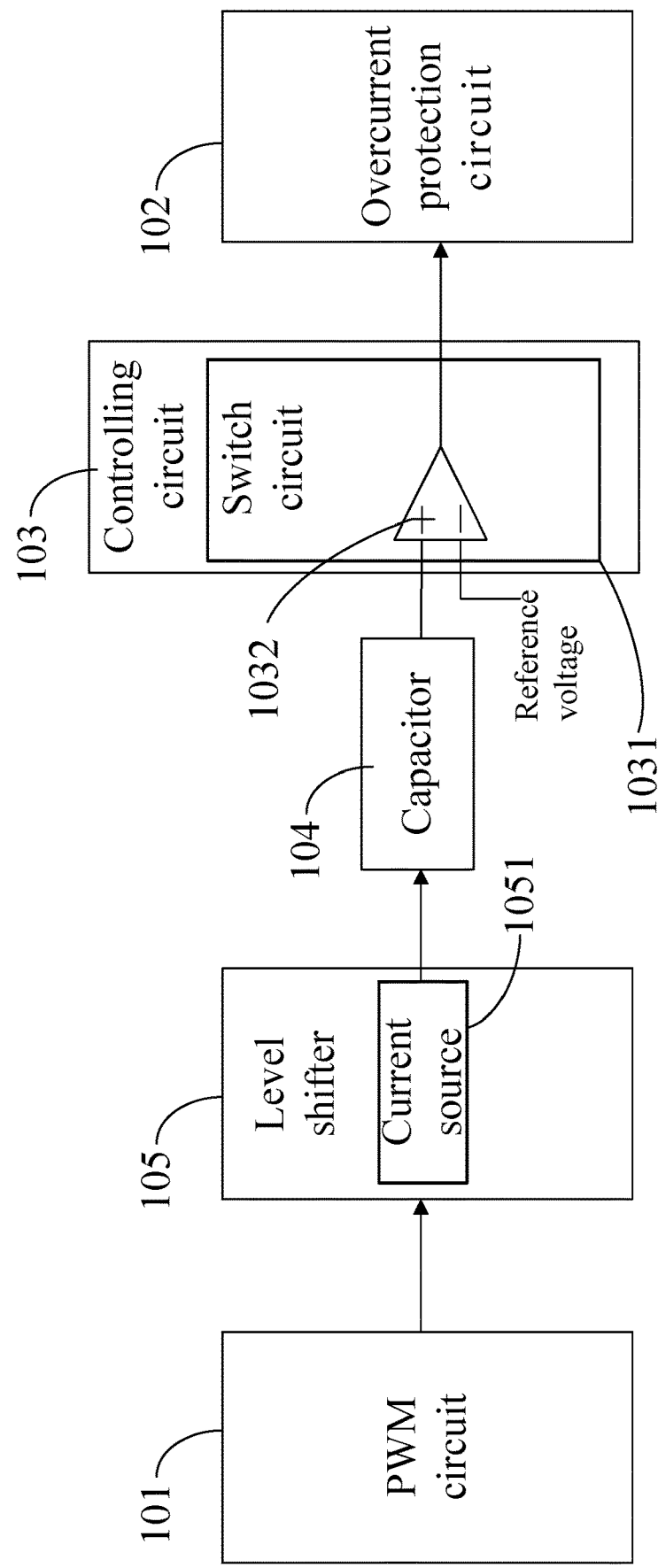

LIQUID CRYSTAL DISPLAY PANEL AND CONTROLLING CIRCUIT

BACKGROUND

1. Field of the Disclosure

The present disclosure relates to the field of a liquid crystal display (LCD) technique, and more particularly, to a controlling circuit and an LCD panel with the controlling circuit.

2. Description of the Related Art

With regard to driving a thin film transistor liquid crystal display (TFT LCD) panel of the related art, power supplies are used more and more diversely such as level shifter and pulse width modulation integrated circuit (PWM IC). A large amount of current is often produced when boot-up and shutdown operates due to causes of the difference aging of the panel of the related art, outputting capacitors, and boot-up and shutdown time interval. Practically, such a large amount of current seldom occurs in a normal condition while happening on the boot-up operation. However, overcurrent protection is triggered when boot-up starts, which causes abnormal boot-up and shutdown and unsuccessful operation.

The problem of the LCD panel of the related art is that the current easily increases when the LCD panel is turned on or off, which may cause overcurrent protection and thereby cause the panel to be turned on and off normally.

SUMMARY

An object of the present disclosure is to propose a controlling circuit which can prevent enabling overcurrent protection for a panel on boot-up and shutdown conditions, thereby realizing normal boot-up and shutdown of the panel. The problem of the related art that overcurrent protection easily occurs when a large amount of current is produced on boot-up and shutdown conditions, causing the panel to fail to be turned on and off normally.

According to a first aspect of the present disclosure, a controlling circuit includes a pulse width modulation (PWM) circuit, a level shifter connected to an output terminal of the PWM circuit and having a current source arranged in the level shifter, a capacitor comprising an input terminal connected to an output terminal of the current source that supplies a constant current to the capacitor, an overcurrent protection circuit connected to an output terminal of the level shifter, and a controlling circuit configured to enable or disable a function of overcurrent protection of the overcurrent protection circuit within designated time. The controlling circuit includes a switch device. An input of the switch device is connected to an output terminal of the capacitor. An output terminal of the switch device is connected to a controlling terminal of the overcurrent protection circuit. The designated time is predetermined time which from the start of boot-up operation or shutdown operation correspond to.

According to a preferred embodiment of the present disclosure, the switch device is a comparator that comprises a non-inverting terminal connected to the output terminal of the capacitor, an inverting terminal receiving reference voltage, and an output terminal connected to the overcurrent protection circuit.

According to a preferred embodiment of the present disclosure, the switch device is a triode that comprises a controlling terminal connected to the output terminal of the capacitor, an input terminal connected to an enabling power supply, and an output terminal connected to the overcurrent protection circuit.

According to a preferred embodiment of the present disclosure, an output terminal of the overcurrent protection circuit is connected to a gate driver on array (GOA) circuit.

According to a second aspect of the present disclosure, a controlling circuit includes a pulse width modulation (PWM) circuit, a level shifter connected to an output terminal of the PWM circuit and having a current source arranged in the level shifter, a capacitor comprising an input terminal connected to an output terminal of the current source that supplies a constant current to the capacitor, an overcurrent protection circuit connected to an output terminal of the level shifter, and a controlling circuit configured to enable or disable a function of overcurrent protection of the overcurrent protection circuit within designated time. The controlling circuit includes a switch device. An input of the switch device is connected to an output terminal of the capacitor. An output terminal of the switch device is connected to a controlling terminal of the overcurrent protection circuit.

According to a preferred embodiment of the present disclosure, the switch device is a comparator that comprises a non-inverting terminal connected to the output terminal of the capacitor, an inverting terminal receiving reference voltage, and an output terminal connected to the overcurrent protection circuit.

According to a preferred embodiment of the present disclosure, the switch device is a triode that comprises a controlling terminal connected to the output terminal of the capacitor, an input terminal connected to an enabling power supply, and an output terminal connected to the overcurrent protection circuit.

According to a preferred embodiment of the present disclosure, an output terminal of the overcurrent protection circuit is connected to a gate driver on array (GOA) circuit.

According to a third aspect of the present disclosure, a liquid crystal display (LCD) panel includes an LCD body and a controlling circuit. The controlling circuit includes a pulse width modulation (PWM) circuit, a level shifter connected to an output terminal of the PWM circuit and having a current source arranged in the level shifter, a capacitor comprising an input terminal connected to an output terminal of the current source that supplies a constant current to the capacitor, an overcurrent protection circuit connected to an output terminal of the level shifter, and a controlling circuit configured to enable or disable a function of overcurrent protection of the overcurrent protection circuit within designated time. The controlling circuit includes a switch device. An input of the switch device is connected to an output terminal of the capacitor. An output terminal of the switch device is connected to a controlling terminal of the overcurrent protection circuit.

According to a preferred embodiment of the present disclosure, the switch device is a comparator that comprises a non-inverting terminal connected to the output terminal of the capacitor, an inverting terminal receiving reference voltage, and an output terminal connected to the overcurrent protection circuit.

According to a preferred embodiment of the present disclosure, the switch device is a triode that comprises a controlling terminal connected to the output terminal of the capacitor, an input terminal connected to an enabling power supply, and an output terminal connected to the overcurrent protection circuit.

According to a preferred embodiment of the present disclosure, the designated time is predetermined time which from the start of boot-up operation or shutdown operation correspond to.

According to a preferred embodiment of the present disclosure, an output terminal of the overcurrent protection circuit is connected to a gate driver on array (GOA) circuit.

Compared with the controlling circuit of the related art, a controlling circuit is arranged in the controlling circuit proposed by the present disclosure. The controlling circuit controls an overcurrent protection circuit to turn on properly, which realizes normal boot-up and shutdown of the panel. As for the problem that the current easily rises when the LCD panel of the related art is turned on or off, which may cause overcurrent protection and thereby cause the panel to fail to be turned on and off normally. The embodiment of the present disclosure can solve the problem successfully.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a block diagram of a controlling circuit according to a preferred embodiment of the present disclosure.

DETAILED DESCRIPTION OF THE EMBODIMENTS

Spatially relative terms, such as "beneath", "below", "lower", "above", "upper" and the like, may be used herein for ease of description to describe one element or feature's relationship to another element(s) or feature(s) as illustrated in the FIGURES. It will be understood that the spatially relative terms are intended to encompass different orientations of the device in use or operation in addition to the orientation depicted in the FIGURES.

As for the LCD panel of the related art, the current easily rises when the LCD panel is turned on or off, which may cause overcurrent protection and thereby cause the panel to fail to be turned on and off normally. The problem of the related art can be well dealt with by the embodiment of the present disclosure.

As FIG. 1 illustrates, the controlling circuit capable of controlling boot-up/shutdown of the LCD panel proposed by the present disclosure includes a pulse width modulation (PWM) circuit 101, a level shifter 105, and a capacitor 104. The PWM circuit 101 is configured to generate a pulse signal which can change pulses. The level shifter 105 is configured to shift an input current from at a high voltage level to at a low voltage level and vice versa. A current source 1051 is arranged in the level shifter 105. The current source 1051 is configured to supply a constant current. The capacitor 104 is arranged outside the level shifter 105. An input terminal of the capacitor 104 is connected to an output terminal of the current source 1051. The current source 1051 charges the capacitor 104. An output terminal of the capacitor 104 outputs a controlling signal.

The controlling circuit further includes an overcurrent protection circuit 102. The overcurrent protection circuit 102 is connected to the level shifter 105. A controlling circuit 103 is arranged between the level shifter 105 and the overcurrent protection circuit 102. The controlling circuit 103 includes one or more a switch device 1031. An input of the switch device 1031 is connected to an output terminal of the capacitor 104. An output terminal of the switch device 1031 is connected to a controlling terminal of the overcurrent protection circuit 102.

An output terminal of the overcurrent protection circuit 102 is connected to a gate driver on array (GOA) circuit. The GOA circuit is configured to drive the display of the pixels. The overcurrent protection circuit 102 lowers the current and then outputs the current while a large amount of current flows through instantaneously, which prevents the GOA circuit from being damaged by an overloaded current.

The controlling circuit 103 is configured to enable or cancel a function of overcurrent protection of the overcurrent protection circuit 102 within the designated time, thereby selectively controlling the volume of current which flows to the GOA circuit.

When the LCD panel is turned on, the current flows through the PWM circuit 101, and the PWM circuit 101 outputs the pulse signal. The output pulse signal enters the level shifter 105. The current source 1051 is arranged in the level shifter 105 and outputs the constant current to charge the capacitor 104. The charging duration of the capacitor 104 is controlled by the pulse width of the pulse signal to control the voltage imposed on the capacitor 104. The switch device 1031 outputs a corresponding signal to the overcurrent protection circuit 102 based on the voltage imposed on the capacitor 104. The overcurrent protection circuit 102 decides to enable the function of overcurrent protection according to the input signal. For example, the current flowing through the overcurrent protection circuit 102 is not pulled down by the overcurrent protection circuit 102 at the moment of boot-up to turn on the GOA circuit normally. Another example is that the current flowing through the overcurrent protection circuit 102 is pulled down by the overcurrent protection circuit 102 after the panel has been turned on for a period of time. The current flows into the GOA circuit to drive the LCD panel.

The switch device 1031 is a comparator 1032. A non-inverting terminal of the comparator 1032 is connected to an output terminal of the capacitor 104. An inverting terminal of the comparator 1032 receives reference voltage. An output terminal of the comparator 1032 is connected to the overcurrent protection circuit 102.

When the controlling circuit works, the capacitor 104 supplies the controlling voltage to the comparator. After the comparator compares the controlling voltage with the reference voltage, a high voltage level or a low voltage level is output to control the overcurrent protection circuit. For example, when the controlling voltage is less than the reference voltage, the comparator outputs the low voltage level, and the overcurrent protection circuit 102 is turned off; when the controlling voltage is greater than the reference voltage, the comparator outputs the low voltage level, and the overcurrent protection circuit 102 is turned on.

The switch device 1031 may be a triode. A controlling terminal of the triode is connected to the output terminal of the capacitor 104. An input terminal of the triode is connected to an enabling power supply. An output terminal of the triode is connected to the overcurrent protection circuit 102. The capacitor 104 supplies the controlling voltage to the controlling terminal of the triode. The enabling power supply supplies enabling voltage to the overcurrent protection circuit 102. After the controlling voltage reaches the conducted amount of voltage of the triode, the enabling voltage is output to the overcurrent protection circuit 102 through the input terminal of the triode and the output terminal of the triode subsequently, thereby enabling the overcurrent protection circuit 102.

When the controlling circuit operates, the capacitor 104 supplies the controlling voltage to the controlling terminal of the triode. Take an N-type metal-oxide-semiconductor (MOS) transistor for example. The capacitor 104 supplies a high-voltage-level controlling voltage to the controlling terminal of the triode. The MOS transistor is turned on. The overcurrent protection circuit 102 is enabled once the enabling voltage is imposed on the overcurrent protection circuit 102. For example, the capacitor 104 supplies a low-voltage-level controlling voltage to the controlling terminal of the triode within the designated time of boot-up operation. The MOS transistor is cut off. The overcurrent protection circuit 102 is closed once the enabling voltage is not imposed on the overcurrent protection circuit 102.

The present disclosure also provides a liquid crystal display (LCD) panel having an LCD body and a controlling circuit. The controlling circuit includes a pulse width modulation (PWM) circuit, a level shifter connected to an output terminal of the PWM circuit and having a current source arranged in the level shifter, a capacitor comprising an input terminal connected to an output terminal of the current source that supplies a constant current to the capacitor, an overcurrent protection circuit connected to an output terminal of the level shifter, and a controlling circuit configured to enable or disable a function of overcurrent protection of the overcurrent protection circuit within designated time. The controlling circuit includes a switch device. An input of the switch device is connected to an output terminal of the capacitor. An output terminal of the switch device is connected to a controlling terminal of the overcurrent protection circuit.

The working principle of the LCD panel proposed by the present embodiment is consistent with the controlling circuit of the LCD panel introduced in the above-mentioned embodiment.

The details of the working principle of the controlling circuit of the LCD panel have been discussed above, which can be referred if needed.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A controlling circuit, comprising:
   a pulse width modulation (PWM) circuit;
   a level shifter, connected to an output terminal of the PWM circuit; a current source arranged in the level shifter;
   a capacitor, comprising an input terminal connected to an output terminal of the current source that supplies a constant current to the capacitor;
   an overcurrent protection circuit, connected to an output terminal of the level shifter; and
   a controlling circuit, configured to enable or disable a function of overcurrent protection of the overcurrent protection circuit within designated time; the controlling circuit comprising a switch device; an input of the switch device connected to an output terminal of the capacitor; an output terminal of the switch device connected to a controlling terminal of the overcurrent protection circuit; the designated time is predetermined time which from the start of boot-up operation or shutdown operation correspond to,
   wherein the switch device is a comparator that comprises a non-inverting terminal connected to the output terminal of the capacitor, an inverting terminal receiving a reference voltage, and an output terminal connected to the overcurrent protection circuit.

2. The controlling circuit of claim 1, wherein an output terminal of the overcurrent protection circuit is connected to a gate driver on array (GOA) circuit.

3. A controlling circuit, comprising:
   a pulse width modulation (PWM) circuit;
   a level shifter, connected to an output terminal of the PWM circuit; a current source arranged in the level shifter;
   a capacitor, comprising an input terminal connected to an output terminal of the current source that supplies a constant current to the capacitor;
   an overcurrent protection circuit, connected to an output terminal of the level shifter; and
   a controlling circuit, configured to enable or disable a function of overcurrent protection of the overcurrent protection circuit within designated time; the controlling circuit comprising a switch device; an input of the switch device connected to an output terminal of the capacitor; an output terminal of the switch device connected to a controlling terminal of the overcurrent protection circuit,
   wherein the switch device is a comparator that comprises a non-inverting terminal connected to the output terminal of the capacitor, an inverting terminal receiving a reference voltage, and an output terminal connected to the overcurrent protection circuit.

4. The controlling circuit of claim 3, wherein an output terminal of the overcurrent protection circuit is connected to a gate driver on array (GOA) circuit.

5. A liquid crystal display (LCD) panel comprising an LCD body and a controlling circuit, the controlling circuit comprising:
   a pulse width modulation (PWM) circuit;
   a level shifter, connected to an output terminal of the PWM circuit; a current source arranged in the level shifter;
   a capacitor, comprising an input terminal connected to an output terminal of the current source that supplies a constant current to the capacitor;
   an overcurrent protection circuit, connected to an output terminal of the level shifter; and
   a controlling circuit, configured to enable or disable a function of overcurrent protection of the overcurrent protection circuit within designated time; the controlling circuit comprising a switch device; an input of the switch device connected to an output terminal of the capacitor; an output terminal of the switch device connected to a controlling terminal of the overcurrent protection circuit,
   wherein the switch device is a comparator that comprises a non-inverting terminal connected to the output terminal of the capacitor, an inverting terminal receiving a reference voltage, and an output terminal connected to the overcurrent protection circuit.

6. The LCD panel of claim 5, wherein the designated time is predetermined time which from the start of boot-up operation or shutdown operation correspond to.

7. The LCD panel of claim 5, wherein an output terminal of the overcurrent protection circuit is connected to a gate driver on array (GOA) circuit.

\* \* \* \* \*